United States Patent [19]

Jaffré et al.

[11] Patent Number: 4,731,797
[45] Date of Patent: Mar. 15, 1988

[54] CIRCUIT FOR IMPLEMENTING A LOW ACCUMULATED DISPARITY CODE IN HIGH DATA RATE DIGITAL TRANSMISSION, AND A CODING METHOD USING SUCH A CIRCUIT

[75] Inventors: Pierre Jaffré, Lannion; Maurice Niquel, Perros Guirec; Christian Tanguy, Lannion, all of France

[73] Assignee: Alcatel, Paris, France

[21] Appl. No.: 927,198

[22] Filed: Nov. 5, 1986

[30] Foreign Application Priority Data

Nov. 5, 1985 [FR] France ................................ 85 16372

[51] Int. Cl.$^4$ ............................................. H04L 25/34
[52] U.S. Cl. ................................. 375/19; 340/347 DD
[58] Field of Search ............ 375/19, 25; 340/347 DD; 360/39-41; 371/56

[56] References Cited

U.S. PATENT DOCUMENTS

| | | | |
|---|---|---|---|
| 4,027,335 | 5/1977 | Miller | 375/19 |
| 4,499,454 | 2/1985 | Shimada | 360/40 |
| 4,620,311 | 10/1986 | Schouhamer | 375/19 |
| 4,626,826 | 12/1986 | Fukuda et al. | 375/19 |

FOREIGN PATENT DOCUMENTS

| | | |
|---|---|---|
| 0150082 | 7/1985 | European Pat. Off. |
| 2012845 | 7/1969 | France |
| 2469047 | 5/1981 | France |
| 1540617 | 2/1979 | United Kingdom |

OTHER PUBLICATIONS

Frequenz, vol. 34, No. 2, Feb. 1980, pp. 45-52, Berlin, DE.

Electronics Letters, vol. 5, No. 4, Feb. 20, 1969, pp. 79-81.

Free International Conference on Communications, Conference Record, vol. 2, Jun. 19-22, 1983, Boston, U.S., pp. 690-694.

Second International Conference on Telecommunication Transmission—Into the Digital Era, Mar. 17-20, 1981, London, GB, pp. 213-216.

The Bell System Technical Journal, vol. 53, No. 6, Jul.-Aug. 1974, pp. 1103-1126, American Telephone and Telegraph Company, U.S.

Primary Examiner—Robert L. Griffin
Assistant Examiner—Stephen Chin
Attorney, Agent, or Firm—Sughrue, Mion, Zinn, Macpeak, and Seas

[57] ABSTRACT

First and second parallel-connected calculating units (12, 18) simultaneously calculate the sum $\Sigma_n = \Sigma_{n-1} + Sn$ and the difference $\Sigma'_n = \Sigma_{n-1} - Sn$ where the Sn is equal to one-half of the difference between the number of 1-bits and the number of 0-bits in a binary word to be transmitted and:

$$\Sigma_n = \sum_{k=0}^{n} Sk$$

A comparator circuit (22) compares the signs of $\Sigma_{n-1}$ and Sn and the result of the comparison is used to reset the output from one of said calculating units to zero. The sum unit (12, 18) is reset to zero when the signs are different and the difference unit (13, 19) when the signs are equal, in which case the bits of the transmitted word are inverted. The sign comparison bit is also transmitted as an additional bit of the transmitted word.

9 Claims, 3 Drawing Figures

CIRCUIT FOR IMPLEMENTING A LOW ACCUMULATED DISPARITY CODE IN HIGH DATA RATE DIGITAL TRANSMISSION, AND A CODING METHOD USING SUCH A CIRCUIT

The present invention relates to a circuit for implementing a low accumulated disparity code in high data rate digital transmission, for example at 8 times 140 megabits per second, and to a coding method using such a circuit.

BACKGROUND OF THE INVENTION

When performing digital transmission at very high data rates, such as that mentioned above, it is desirable for each train of binary 0 or 1 pulses constituting a signal should have no DC component and should have very low energy density in the low frequency portion of the spectrum. One of the problems lies in the optical transmitter and receiver heads which are used having a low frequency cutoff. Another lies in the need to use low frequency transmission both for service information and for remote surveillance information, and the need to avoid them interfering.

One known method of satisfying the above requirements is described in U.S. Pat. No. 3,405,235 in which a digital train is transmitted in parallel over a plurality of paths as a series of parallel-transmitted words subjected to a block code designed so that the accumulated disparity:

$$\Sigma_n = \sum_{k=0}^{k=n} Sk$$

remains low, where n is the number of the most recently transmitted word, and Sk is the "sum" of the k-th word such that Sk equals the number of 1-bits minus the number of 0-bits in the k-th word.

The low accumulated disparity coding method as described in said U.S. patent is as follows:

if $\Sigma_{n-1}$ and Sn have the same sign, then the word of sum Sn is inverted, i.e. its 0-bits are transformed into 1-bits and vice-versa; and if $\Sigma_{n-1}$ and Sn are of opposite sign, the word of sum Sn is transmitted unchanged.

Prior circuits for implementing such low accumulated disparity codes use either programmable memories which cannot be used at the required high data rate because of their excessive access times, or else they use one or more adders which cannot be used either since their maximum operating frequency is too low and their propagation time is too high to be used at such high data rates, e.g. data rates of about 140 megabits/second.

SUMMARY OF THE INVENTION

Preferred implementations of the present invention mitigate the above drawbacks by using two units for calculating $\Sigma_n = \Sigma_{n-1} + Sn$ and $\Sigma'_n = \Sigma_{n-1} - Sn$ which operate simultaneously and in parallel.

More precisely, the present invention provides a circuit for implementing a low accumulated disparity code for high data rate digital transmission of information grouped in the form of x-digit binary words, with an n-th word having a sum Sn equal to one half of the difference between the number of 1-bits and the number of 0-bits in said word, said circuit comprising:

a calculating circuit for calculating said sum Sn;
a calculating unit for calculating the accumulated disparity:

$$\Sigma_n = \sum_{k=0}^{n} Sk$$

a comparator circuit for comparing the signs of $\Sigma_{n-1}$ and Sn;
a encoding circuit for encoding the n-th word; and
a clock circuit delivering clock signals;
the overall coding circuit including the improvement whereby said unit for calculating the accumulated disparity comprises a first unit for calculating the sum $\Sigma_n = \Sigma_{n-1} + Sn$ and a second calculating unit for calculating the difference $\Sigma'_n = \Sigma_{n-1} - Sn$ disposed in parallel, with the sign comparator circuit having an output which is directly connected to a reset to zero input for the first calculating unit, to a control input of the encoding circuit, and to one of the inputs to said encoding circuit to form an (x+1)-th output bit from said encoding circuit, and indirectly via an inverter to a reset to zero input for the second calculating unit.

The present invention has the considerable advantage of allowing digital transmission to take place at a high data rate, for example at 8 times 140 megabits/second.

This may be achieved by performing digital transmission on a plurality of paths in parallel, with a word then being formed by the set of data bits which arrive simultaneously via said paths.

BRIEF DESCRIPTION OF THE DRAWINGS

An embodiment of the invention is described by way of example with reference to the accompanying drawings, in which.

MORE DETAILED DESCRIPTION

Figure 1:
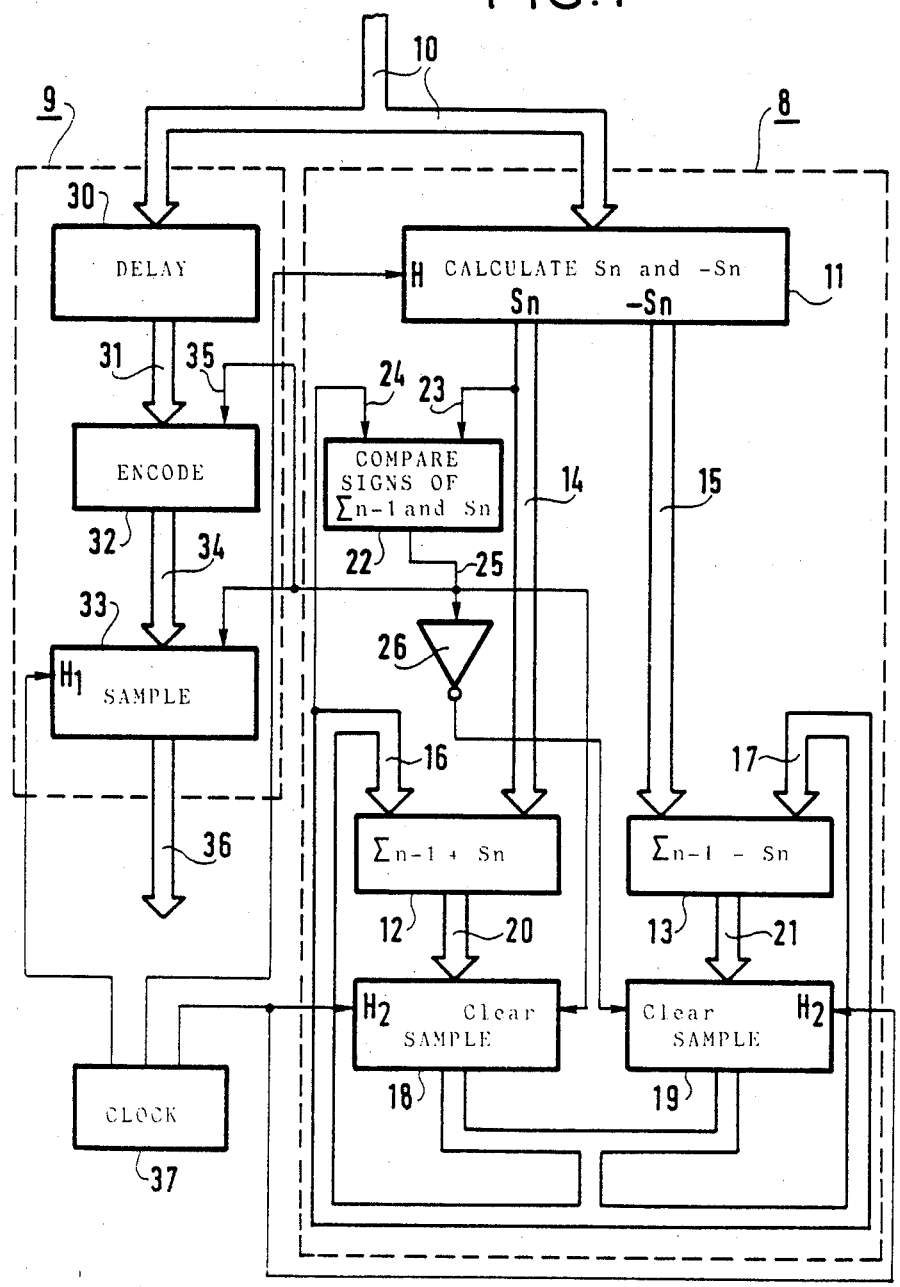
FIG. 1 is a block diagram of a coding circuit in accordance with the invention.

A coding circuit in accordance with the invention comprises two units 8 and 9 disposed in parallel: the unit 8 is a unit for calculating the accumulated disparity $\Sigma_n$; and the unit 9 is a unit for encoding the words to be transmitted.

Both units 8 and 9 have x parallel input paths which are connected to a common set 10 of x parallel signal inputs.

The first unit 8 comprises a calculating circuit 11 for calculating a sum Sn such that 2Sn equals the number of 1-bits minus the number of 0-bits in the n-th word constituted by the input data signals applied in parallel to said calculating circuit 11.

The calculating circuit 11 also calculates −Sn.

The calculated sums Sn and −Sn are delivered on respective parallel output connections 14 and 15 to first inputs of respective first and second adders 12 and 13 for calculating $\Sigma_{n-1} Sn$ and $\Sigma_{n-1} - Sn$, respectively, where the accumulated disparity $\Sigma_{n-1}$ is such that:

$$\Sigma_{n-1} = \sum_{k=0}^{n-1} Sk$$

The second inputs of the adders 12 and 13 are connected via respective parallel input connections 16 and 17 to the outputs from first and second samplers 18 and 19 whose inputs are connected to respective outputs from the adders 12 and 13 via respective parallel connections 20 and 21.

A sign comparator circuit 22 for comparing the signs of $\Sigma_{n-1}$ and Sn has a first input connection 23 connected to the sign output lead in the set of connections 14 conveying the sum Sn and a second input connection 24 connected to the sign lead in one of the sets of parallel connections 16 and 17 both of which convey a word representative $\Sigma_{n-1}$. The comparator circuit 22 has an output connection 25 connected directly to the clear (i.e. reset to zero) input of the first sampler 18 and indirectly to the clear input of the second sampler 19 via an inverter 26.

The second unit 9 comprises a delay circuit 30 which receives the x parallel input paths 10 in parallel with the calculating circuit 11.

The x output connections 31 from the delay circuit 30 are connected to an encoding circuit 32 for optionally inverting the bits on said x paths.

A third sampler 33 is connected to the parallel output connections 34 from the encoding circuit 32.

The encoding circuit 32 has a control input 35 which is connected to the output 25 from the comparator circuit 22 for comparing the signs of $\Sigma_{n-1}$ and Sn. This comparator output 25 is also connected to an input to the third sampler 33 in order to constitute an (x+1)-th input path thereto, such that the third sampler 33 has (x+1) output connections 36.

A clock circuit 37 delivers various clock signals Hi at the same frequency but at different phases relative to one another to the calculating circuit 11 and to the samplers 18, 19, and 33. In FIG. 1, the calculating circuit 11 is shown as having a single clock input H, but this represents three separate clock inputs H$_3$ and H$_4$ and H$_5$ which are shown separately in FIG. 2.

In operation, input information arrives in the form of parallel trains of binary pulses and a word is constituted by the set of binary inputs simultaneously applied to the coding circuit in accordance with the invention. After obtaining Sn and −Sn, the circuit in accordance with the invention simultaneously compares the signs of $\Sigma_{n-1}$ and Sn, while using its two low propagation time adders 12 and 13 to calculate $\Sigma_n = \Sigma_{n-1} + Sn$ and $\Sigma'_n = \Sigma_{n-1} - Sn$.

The output signal from the comparator 22 serves, when the signs of $\Sigma_{n-1}$ and Sn are different to reset the second sampler 19 to zero, and when the signs are equal to reset the first sampler 18 to zero and also to control the inverter circuit 2 to invert all the bits of the n-th word while simultaneously setting the (x+1)-th bit in the output from the third sampler 33 to level 1 in order to indicate that the n-th word has been inverted.

The delay circuit 30 compensates for the time taken to compare the signs of $\Sigma_{n-1}$ and Sn and the time taken for a possible inversion control signal resulting from said comparison to take effect in the coding circuit 32 prior to applying the bits of the n-th word to its inputs.

A circuit in accordance with the invention thus enables each word in a data train to be encoded in such a manner that the accumulated disparity $\Sigma_n$ remains low.

In a particular embodiment it is assumed that the circuit in accordance with the invention has eight input paths.

Figure 2:
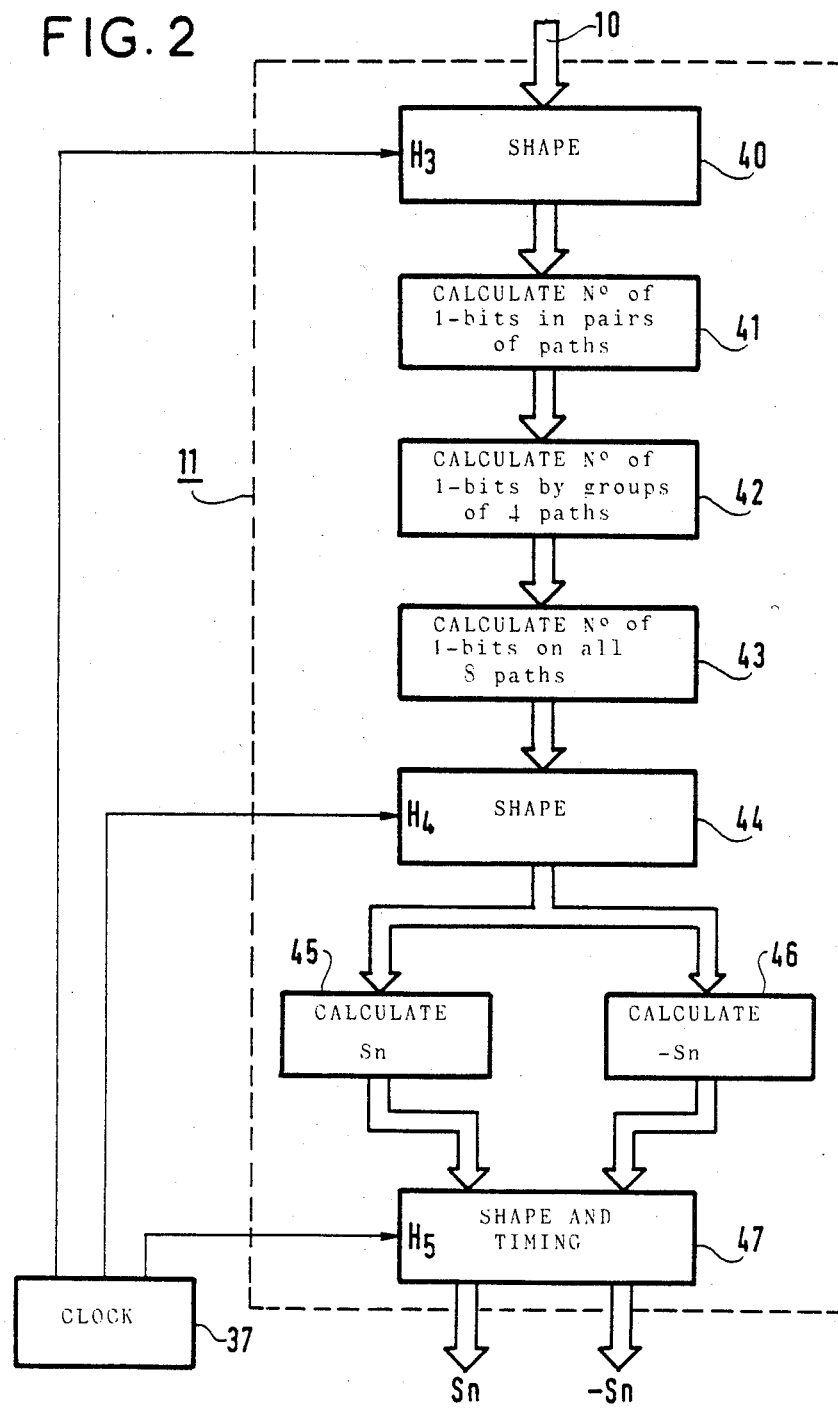
FIG. 2 is a more detailed block diagram of a portion of the circuit shown in FIG. 1.

The calculating circuit 11 is shown in greater detail in FIG. 2.

The signals conveyed by the eight paths are initially applied to a shaping circuit 40.

A first calculating circuit 41 is then used to obtain the number N1 of 1-bits present in the n-th word with the input paths being taken in pairs in a manner known to the person skilled in the art. For example, for a pair of paths V1 and V2, the more significant bit in each pair is given by V1.V2 and the less significant bit by V1+V2. Adders 42 and 43 are then used for converting the number N1 expressed as four pairs to the same number expressed as two sets of four paths and finally to the same number expressed as one set of eight paths. These circuits are followed by a second shaper circuit 44.

If the truth tables for Sn and N1 are written out for the eight path case, it can be seen in a manner which is well known to the person skilled in the art that $Sn = N1 - 4$ and thus that $-Sn = 4 - N1 = \overline{N1} + 5$, in twos complement form. Circuits 45 and 46 which are known to the person skilled in the art are used for obtaining these values Sn and −Sn.

The signals representative of Sn and −Sn are then shaped and put into phase by a circuit 47.

After $\Sigma_n = \Sigma_{n-1} + Sn$ and $\Sigma'_n = \Sigma_{n-1} - Sn$ have been calculated, the first and second samplers 18 and 19 serve to reshape and rephase $\Sigma_n$ and $\Sigma'_n$.

Which one of the values $\Sigma_n$ and $\Sigma'_n$ is selected depends on the sign comparison between $\Sigma_{n-1}$ and Sn.

By resetting one of these two values to zero, a "wired-OR" circuit serves to obtain the value of the accumulated disparity $\Sigma_n$ for use in calculating $\Sigma_{n+1} = \Sigma_n \pm Sn$.

The circuit for inverting the bits of the n-th word may be implemented in the form of "exclusive-OR" gates each having one input connected to the output from the comparator circuit 22 and its other input connected to a respective data bit. The third sampler 33 then serves to shape the eight paths together with a ninth path for conveying the output signal from said comparator 22.

Figure 3:
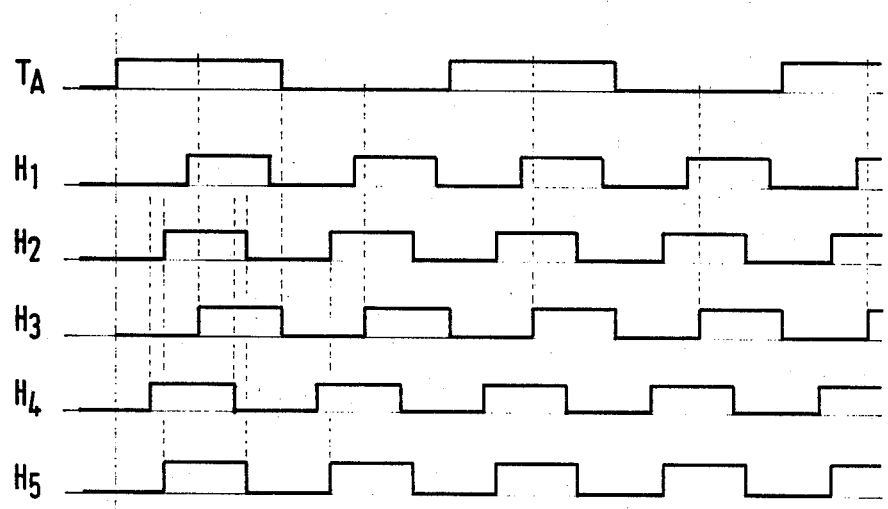
FIG. 3 is a waveform diagram showing the phases of the various clock signals relative to the phase of the data train.

The waveform diagrams shown in FIG. 3 correspond to the coding circuit in accordance with the invention being made from ECL 100,000 technology, for use with input data trains (T$_A$) appearing at 10 at 140 Mb/s (giving a period of 7.2 ns).

The phase shift between H$_4$ and H$_3$ results from the 1.7 period delay (12 ns at 140 Mb/s) inserted by the circuits 40, 41, 42, and 43.

The delay in H$_5$ relative to H$_4$ results from the propagating time due to the circuits 44 and 45 (or 46), which is equal to about 1.1 periods (i.e. 7.5 ns).

H$_2$ is synchronized with H$_5$ since the propagation time of the circuits in the calculation loop is about one period.

The phase difference between H$_1$ and H$_3$ is due to the propagation time introduced by the circuits 30 and 32 which is about 3.9 periods or about 27.5 ns at 140 Mb/s.

Naturally the present invention has been described solely with reference to a preferred embodiment and its component parts could be replaced with equivalent parts without going beyond the scope of the invention.

For example, the binary pulse trains could be transmitted over a single serial link at a frequency of x times the base frequency and could then be demultiplexed at the input to the circuit for subsequent processing as x parallel bit paths.

We claim:

1. A circuit for implementing a low accumulated disparity code for high data rate digital transmission of information grouped in the form of x-digit binary words, with an n-th word having a sum Sn equal to one half of the difference between the number of 1-bits and the number of 0-bits in said word, said circuit comprising:
- a calculating circuit for calculating said sum Sn for a sequence of values of n;
- a calculating unit for calculating the accumulated disparity for said sequence of values of n:

$$\Sigma_n = \sum_{k=0}^{n} Sk$$

- a comparator circuit for comparing the signs of $\Sigma_{n-1}$ and Sn; and
- an encoding circuit for encoding the n-th word;
- the overall coding circuit including the improvement whereby said unit for calculating the accumulated disparity comprises a first unit for calculating the sum $\Sigma_n = \Sigma_{n-1} + Sn$ and a second calculating unit for calculating the difference $\Sigma'_n = \Sigma_{n-1} - Sn$ disposed in parallel, with the sign comparator circuit having an output which is directly connected to a reset to zero input for the first calculating unit, to a control input of the encoding circuit, and to one of the inputs to said encoding circuit to form an (x+1)-th output bit from said encoding circuit, and indirectly via an inverter to a reset to zero input for the second calculating unit.

2. A circuit according to claim 1, wherein digital transmission takes place over a plurality of paths in parallel, with a word being formed by the set of bits which arrive simultaneously on said paths.

3. A circuit according to claim 1, wherein each calculating unit for calculating the sum or the difference of $\Sigma_{n-1}$ and Sn comprises an adder followed by a sampler.

4. A circuit according to claim 1, wherein the circuit for calculating Sn comprises at least:
- a first shaper circuit;
- circuits for calculating the number of 1-bits in the n-th word;
- a second shaper circuit;
- circuits for calculating Sn and −Sn; and
- a circuit for shaping and defining the phase position of Sn and −Sn.

5. A circuit according to claim 1, wherein the encoder serves to invert all of the bits of the n-th word in the presence of a suitable control signal, said coder being followed by a sampler.

6. A circuit as claimed in claim 1, wherein said first and second calculating units and the comparator circuit simultaneously calculate the sum $\Sigma_n = \Sigma_{n-1} + Sn$ and the difference $\Sigma'_n = \Sigma_{n-1} - Sn$ with the signs of $\Sigma_{n-1}$ and Sn being compared and further comprising sampling means for, if the signs are different, resetting $\Sigma'_n$ to zero and selecting $\Sigma_n$ as the new value of the accumulated disparity, and for, if the signs are equal, resetting $\Sigma_n$ to zero and selecting $\Sigma'_n$ as the new value of the accumulated disparity and inverting all of the bits of the n-th word.

7. A circuit according to claim 1, wherein the clock has a plurality of outputs on which it provides clock signals at different relative phase positions, said signals being connected to the various samplers and shapers.

8. An encoding method for implementing a low accumulated disparity code for high data rate digital transmission of information grouped in the form of x-digit binary words, with an n-th word having a sum Sn equal to one half of the difference between the number of 1-bits and the number of 0-bits in said word, said method comprising:
- calculating said sum Sn for a sequence of values of n;
- calculating the accumulated disparity for said sequence of values of n:

$$\Sigma_n = \sum_{k=0}^{n} Sk$$

- comparing the signs of $\Sigma_{n-1}$ and Sn;
- encoding the n-th word; and
- the overall method including the improvement whereby said step of calculating the accumulated disparity comprises a first step for calculating the sum $\Sigma_n = \Sigma_{n-1} + Sn$ and a second step for calculating the difference $\Sigma'_n = \Sigma_{n-1} - Sn$ performed in parallel, with the sign comparing step producing an output which resets to zero the first calculating step, which controls the encoding step, and which inputs to said encoding step to form an (x+1)-th output bit from said encoding step, and which after inversion resets to zero the second calculating step.

9. An encoding method as claimed in claim 8, wherein the sum $\Sigma_n = \Sigma_{n-1} + Sn$ and the difference $\Sigma'_n = \Sigma_{n-1} - Sn$ are calculated simultaneously with the signs of $\Sigma_{n-1}$ and Sn being compared, if the signs are different $\Sigma'_n$ is reset to zero and $\Sigma_n$ is selected as the new value of the accumulated disparity, if the signs are equal $\Sigma_n$ is reset to zero and $\Sigma'_n$ is selected as the new value of the accumulated disparity and all of the bits of the n-th word are inverted.

* * * * *